United States Patent [19]

Thompson, III

[11] Patent Number: 5,228,920
[45] Date of Patent: Jul. 20, 1993

[54] FILM COATING UNIT

[76] Inventor: Ernest E. Thompson, III, 2420 Dutch Hollow Rd., Avon, N.Y. 14414

[21] Appl. No.: 709,181

[22] Filed: Jun. 3, 1991

[51] Int. Cl.⁵ .............................................. B05C 1/08
[52] U.S. Cl. .................... 118/670; 118/680; 118/668; 118/235; 118/236; 118/253; 118/261; 118/DIG. 15
[58] Field of Search ............... 118/670, 676, 680, 620, 118/210, 236, 235, 239, 244, 253, 261, DIG. 15, 668

[56] References Cited

U.S. PATENT DOCUMENTS

| | | | |
|---|---|---|---|
| 2,051,222 | 8/1936 | Odell | 118/DIG. 15 |
| 2,229,621 | 1/1941 | Bradner . | |
| 2,534,321 | 12/1950 | Taylor . | |
| 2,729,192 | 1/1956 | Warner . | |
| 2,774,329 | 12/1956 | Smith . | |
| 2,912,959 | 11/1959 | Showalter | 118/261 |
| 3,063,407 | 11/1962 | Bergstein . | |
| 3,084,663 | 8/1960 | Warner . | |
| 3,220,377 | 11/1965 | Good . | |
| 3,467,060 | 9/1969 | Klebanow et al. | 118/236 |
| 3,762,365 | 10/1973 | Herzog | 118/261 |
| 3,918,400 | 11/1975 | Cheeseman | 118/261 |
| 3,931,786 | 1/1976 | Teed | 118/261 |
| 4,049,861 | 9/1977 | Nozari . | |
| 4,407,867 | 10/1983 | Brück et al. . | |
| 4,408,400 | 10/1983 | Colapinto . | |
| 4,456,637 | 6/1984 | Takeda et al. . | |
| 4,518,637 | 5/1985 | Takeda et al. . | |
| 4,612,875 | 9/1986 | Keable . | |
| 4,674,438 | 6/1987 | Keable . | |
| 4,828,887 | 5/1989 | Toutant et al. . | |
| 4,949,667 | 8/1990 | Yoshida et al. | 118/261 |

FOREIGN PATENT DOCUMENTS 2442667 8/1980 France .................... 118/261
468783 8/1975 U.S.S.R. ................. 118/261

OTHER PUBLICATIONS

"CJ Laser Film Coating System Model B-1114", CPAC, Inc. (publication date unknown).
"Novel Color Electrophotography: One Drum Color Superimposing Process", Yamamoto et al. Journal of Imaging Technology, 16:228-233 (1990).
"Coating Rods: Equipment, Processes and Applications", R. D. Specialists, Inc. reprinted from Coating Equipment and Processes by George L. Booth (1970).

Primary Examiner—W. Gary Jones
Assistant Examiner—Todd J. Burns
Attorney, Agent, or Firm—Ryan, Kees & Hohenfeldt

[57] ABSTRACT

Apparatus for applying protective coatings to photographic films or papers in web or sheet form. More specifically, apparatus for applying protective coatings that are curable by actinic radiation is provided. The apparatus includes a feeding station for supplying film which may be either a feed spool or a sheet feeder for holding and supplying individual sheets of film. The apparatus further includes a conveyor for conveying the film through a coating station and a curing chamber to a receiving station which also may either be a take-up spool to receive coated cured film or a stacking device to receive a stack of individual sheets of film. The conveyor can either be a series of conveying spools or pulleys or an endless conveyor belt in the case of individual sheets of film. The coating station includes a coating roller having a pattern of grooves formed by winding wire onto the surface thereof or other pattern of surface indentations.

4 Claims, 1 Drawing Sheet

FILM COATING UNIT

BACKGROUND OF THE INVENTION

This invention relates to apparatus for applying protective coatings to photographic films or papers. More specifically, it relates to apparatus for applying protective coatings that are curable by actinic radiation such as ultraviolet light.

Apparatus has heretofore been made available for unwinding, coating, curing and rewinding photographic films or rolls of photographic paper. See for example U.S. Pat. No. 4,612,875 issued to Keable on Sep. 23, 1986 which describes such apparatus which uses a coating roller followed by a smoothing roller. The apparatus also includes a splice detector which causes the film to be lifted off of the applicator rollers and also interrupts the rotation of the rollers.

Protective coating compositions for films are commercially available, for example, the type marketed by 3M Company under the trademark Photogard ® and by Dacar Chemical Co. under the trademark Imagegard ®. Ultraviolet light curable coating compositions are described in U.S. Pat. Nos. 4,049,861 issued Sep. 20, 1977 to Nozarre and U.S. Pat. No. 4,156,046 issued May 22, 1979 to Lien et al. The present invention provides improved apparatus for coating and curing these and similar actinic radiation curable compositions on photographic films or paper.

SUMMARY OF THE INVENTION

An important aspect of the present invention relates to an improved coating composition applicator that eliminates the need for a smoothing or scraping bar or roller which can in some cases cause streaking, variations in thickness or less than optimum smoothness of the coating. The present invention utilizes a continually wiped applicator roller possessing a surface texture formed by winding a wire on a bar, or alternatively by machining a desired texture into the surface.

Another aspect of the invention involves the provision of a splice detector coupled with means to maintain the film in contact with the applicator roller for applying a coating or to disengage it from the same without the need for halting the rotation of the applicator roller. A related aspect of the invention involves the use of a guide roller which usually directs the film into contact with the coating roller or, on signal, out of such contact to accurately control the portions of the film onto which the coating is applied. A further related aspect is the provision of a solenoid controlled guide roller which when extended causes the film to contact the coating roller and which when retracted allows the film to leave contact with the coating roller which continues to rotate, thus providing an intermittent smooth coating without requiring smoothing bars or contact with any other surface. Yet another aspect of the invention involves providing an applicator roller which by use of a coacting wiper or doctor blade provides an accurately metered amount of a smooth coating of a coating composition, the thickness of which is determined by the position of the wiper blade and the size of the grooves or textures in the coating bar. An advantage of the applicator system of the present invention is that by using a wiper blade to remove excess liquid from the wire wound or otherwise textured applicator roller, an optimum coating is provided while minimizing the amount of coating composition being wasted. Another related aspect of the invention relates to the fact that the wiper blade, by pooling up liquid in front of it as the applicator roller rotates, provides a self-cleaning feature for the applicator roller and insures that the grooves or textures are completely filled with liquid. The absence of a back-up roller adjacent to the applicator roller enables the film web to be moved away from the applicator roller to a noncoating position or into contact with the roller in a coating position.

A still further aspect of the invention involves the use of a textured applicator roller which can be used with or without a pick-up roller to transfer coating composition from a reservoir to the applicator roller. Yet another related aspect of the invention relates to the fact that the coating composition is wiped away from the applicator roller except in the indentations or grooves in the surface of the applicator roller thereby providing an accurate metering of the amount of coating composition applied to the film. The coating unit is not limited to a particular width of film or pages, other than by the length of the coating bar.

Summarized briefly, the invention includes a feeding station for supplying film which may be either a feed spool or a feed means for holding and supplying individual sheets of film. The apparatus of the invention further includes means for conveying the film through a coating station and a curing chamber to a receiving station which also may either be a take-up spool to receive coated cured film or a stacking device to receive a stack of individual sheets of film. The conveying means can either be a series of conveying spools or pulleys or an endless conveyor belt in the case of individual sheets of film.

The invention further includes a coating station including a coating roller having a pattern of grooves formed by winding wire onto the surface thereof or other pattern of surface indentations. Drive means is provided for rotating the applicating roller in the direction opposite to the direction of travel of the film and a means such as a reservoir for containing a supply of U.V. or otherwise actinicly curable coating composition, and a means for supplying the coating to the applicator roller either by directly dipping the same in the supply of coating composition or a second transfer roller which rotates in the liquid composition and transfers a supply of the composition to the applicator roller. A wiper or doctor blade is juxtaposed to the surface of the roller in order to control the thickness of coating composition thereon. Generally, optimum coating is achieved by wiping away all but the liquid coating composition contained in the grooves or other surface indentations. Depth of the groove also determines the thickness of the coating.

The apparatus further contains a curing chamber which includes a source of actinic radiation such as a bank of U.V. lights effective to cure the coating composition on the film. Low intensity fluorescent lamps are used to prevent damage to the film or paper but allows for adequate curing of the coating.

The preferred embodiment of the invention further involves the use of the guide roller which in the extended position causes the film to come in contact with the applicator roller but in the retracted position the film is disengaged from contact with the applicator roller. The position of the guide roller is controlled by a splice detector in order to accurately provide for disengagement of the film in the location of a splice between two film segments.

Further aspects, objects and advantages of the invention will be apparent from the accompanying detailed description and drawings.

DESCRIPTION OF THE PREFERRED EMBODIMENTS

Figure 1:
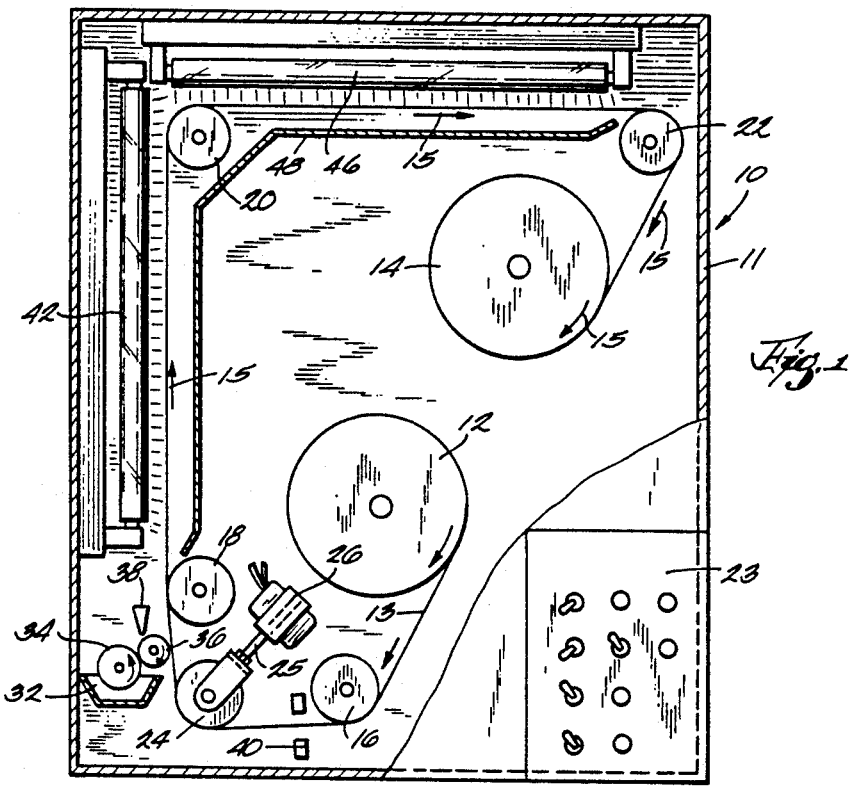
FIG. 1 is a partially diagrammatic side plan view with parts broken away of a photographic film coating apparatus of the present invention.

A preferred embodiment of apparatus for coating continuous webs or strips of photographic film is shown in FIG. 1 and indicated generally by numeral 10. The apparatus includes a housing or enclosure 11 in which a feed spool 12 and a motor-driven take up spool 14 are positioned for rotation. A continuous web 13 of photographic film, which, for example, may be spliced together strips of 35 mm film or the like. A film conveying path traveling in the direction of arrows 15 is defined by a series of guide rollers 16, 18, 20 and 22. The control and/or display panel 23 of conventional design is included on the housing 11 to enable control and monitoring of the function of the apparatus.

Figure 2:
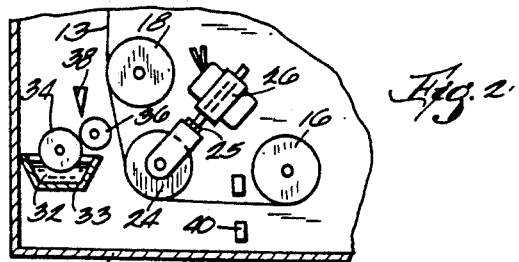
FIG. 2 is a broken away side view of the coating station shown in FIG. 1 with the apparatus in the non-coating position.

An extendable and retractable guide roller 24 mounted on rod 25 controlled by a solenoid 26 is provided for the purpose of changing the path of film 13 from an extended position shown in FIG. 1 to a retracted position shown in FIG. 2. In the extended position, film engages a textured coating applicator roller 36 which is supplied with a layer of a UV curable liquid coating composition 32 by a transfer roller 34. A doctor blade or wiping bar 38 engages the surface of applicator roller 36 in order to accurately meter the amount of coating composition applied to the film.

After application of the coating composition, guide rollers 18, 20 and 22 guide the web of film past banks of ultraviolet lights 42 and 46. Alternatively, light in the violet wavelengths or other actinic radiation can be used depending on the nature of the coating composition.

Figure 3:
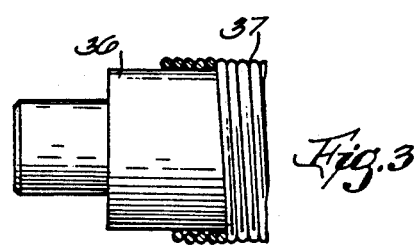
FIG. 3 is a broken away side view of parts in cross-section showing a preferred embodiment of a coating roller.

Applicator roller 36 is provided with a textured surface. This may be accomplished as shown in FIG. 3 by providing a wire wound surface 37 on the exterior of the roller. Surface 37 may be provided with a plated metal coating such as chrome, or may be utilized in an uncoated condition. In alternative embodiments of the invention, the surface texture can be provided by threading or knurling the surface or by laser cutting a desired texture therein. The wiper roll 38, which may be formed of metal, plastic or rubber, continuously wipes the contoured surface of roller 36 thus ensuring that a very thin but accurately metered supply of coating composition is present on the surface. It is generally preferred that only that liquid contained in the depressions of the surface contour be utilized. Thus, a very uniform thin, smooth, continuous coating of the UV curable coating composition can be applied to the film.

In the position shown in FIG. 1, guide roller 24 is extended and causes the film web 13 to come into contact with the roller 36 which is rotating in the reverse direction to that of the travel of web 13. A splice detector 40 is provided upstream of the coating station. Splice detector 40 operates by means of a beam of light, such as infrared light which, when interrupted by a splice in the film, operates solenoid 26 to retract rod 25 thus retracting roller 24 to the position shown in FIG. 2. In practice it is preferred that roller 24 move in an arc such that the film patch length between rollers 16 and 18 is maintained. This makes the placement of the discontinuity in the coating more precise. Since there is no back up roller adjacent to coating roller 36, the film path is enabled to move away from roller 36 as shown in FIG. 2. Unlike previous devices, applicator roller 36 can continue rotating and thus the problems associated with turning motors on and off are avoided. After travel of the splice past the coating station, solenoid 26 is deactivated to return the guide roller 24 to the position shown in FIG. 1.

After coating has been completed, no smoothing operation is necessary. The web of film 13 is caused to travel in front of the ultraviolet lamps 42 and 46 to cause curing of the coating. A reflector 48 protects the feed and take up reels and other components of the apparatus from exposure to the ultraviolet radiation.

Figure 4:
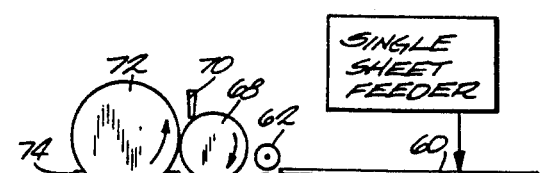
FIG. 4 is a diagrammatic side plan view of a different embodiment of the invention showing the coating of individual sheets of photographic film.
Figure 4:
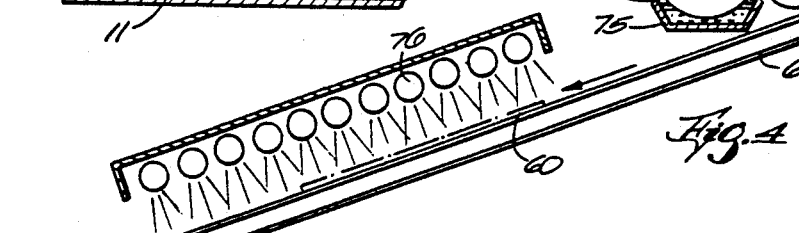

In the alternative embodiment illustrated in FIG. 4, individual sheets of film 60 are fed by feed roller 62 and 64 to a supporting conveyor 66. On passing through the feed roller 62 and 64, the sheets of film 60 are caused to come in contact with a textured applicator roller 68 of identical design to roller 36. A smoothing bar or doctor blade 70 is used to control the thickness of the coating by wiping excess coating material from the applicator roller 68. In this embodiment roller 68 rotates in the same direction as the film or paper in order to aid in the transfer of the substrate while transferring the coating liquid. A pick up roller 72 transfers coating composition 74 from reservoir or tray 75 to applicator roller 68. Coated sheets 60 are then carried by endless conveyor 66 through a curing station where they are exposed to ultraviolet lights 76. Sheets 60 are subsequently accumulated in a receiving container 78 for further processing or handling.

While the preferred embodiment utilizes a transfer roller 34 to apply the coating composition to applicator roller 36, it is possible to use applicator roller 36 by having it directly contact coating composition 32 in reservoir 33. In either event, wiper blade 38 returns the excess coating composition to the reservoir 33. It will be appreciated, however, that if the transfer roller 34 is eliminated, that the applicator roller and reservoir 33 would need to be relocated somewhat so that the film would pass over the applicator roller 36 in a more or less horizontal run rather than a vertically traveling one as shown in the drawings. Such modification is necessitated by virtue of the fact that applicator roller would need to be more directly positioned over reservoir 33.

While the invention has been described with reference to the foregoing preferred embodiments, it will be understood that modifications within the spirit of the invention may be made without departing from the scope of the invention defined in the appended claims.

I claim:

1. Apparatus for coating film with a protective actinic radiation-curable coating comprising:
   a feed station including a spool for supplying a web of film,
   a second station including a spool for receiving coated, cured film,
   means including at least one roller defining a conveying path for conveying film from said feeding station through a coating station and a curing chamber to said second station;
   said coating station comprising
      means for coating said film with an actinic radiation-curable coating composition including a textured coating roller having thereon a pattern of surface indentations, means for rotating said coating roller, means for containing a supply of actinic radiation-curable coating composition, means comprising a transfer roller contacting said coating composition for continuously supplying said coating composition to said coating roller, a blade for wiping the surface of said roller to control the thickness of the coating composition thereon, sand a retractable guide roller that engages the side of said film opposite to the side being coated and at a location displaced from said coating roller so that said film is urged by extension of said retractable roller into engagement with said coating roller and allowed to move away from said coating roller upon retraction of said retractable roller causes said film to contact said coating roller said conveying path causing said film to be conveyed to said curing chamber without contacting any additional smoothing device,
   said curing chamber including a source of actinic radiation effective to cure the coating on said film.

2. Apparatus according to claim 1 further comprising a splice detector coupled to said means for moving the film conveying path whereby said film can remain uncoated in the vicinity of a splice and is coated at locations where no splice is detected.

3. Apparatus according to claim 1 wherein said roller is a wire wound metal roller.

4. Apparatus for coating a flexible substrate with a protective actinic radiation-curable coating comprising:
   a feed station comprising a spool for feeding a continuous web of the substrate,
   a second station comprising a spool for receiving the substrate with a cured coating thereon,
   means comprising at least one roller defining a film conveying path for conveying said web from said feeding station through a coating station and a curing chamber to said second station,
   said coating station comprising
      means for coating said web with an actinic radiation-curable coating composition including a wire wound metal textured coating roller having thereon a pattern of surface indentations, means for rotating said coating roller in a direction such that the surface of the roller facing said film rotates in a direction opposite to the direction of travel of said web, means for containing a supply of actinic radiation-curable coating composition, means for continuously supplying said coating composition to said coating roller, a blade for wiping the surface of said roller to control the thickness of the coating composition thereon, wherein the conveying path for said web causes said web to contact said coating roller, and means for moving the web conveying path from a first location wherein the web does not engage the coating roller to a second location wherein the web engages the coating roller, said means for moving the web conveying path comprising a retractable guide roller that engages the side of said film opposite to the side being coated and at a location displaced from said coating roller so that said film is urged by extension of said retractable roller into engagement with said coating roller and allowed to move away from said coating roller upon retraction of said retractable roller
   a splice detector coupled to said means for moving the web conveying path whereby said web can remain uncoated in the vicinity of a splice and is coated at locations where no splice is detected,
   said curing chamber including a source of actinic radiation effective to cure the coating on said substrate.

* * * * *